United States Patent
Qu et al.

(10) Patent No.: US 7,482,285 B2
(45) Date of Patent: Jan. 27, 2009

(54) DUAL EPITAXIAL LAYER FOR HIGH VOLTAGE VERTICAL CONDUCTION POWER MOSFET DEVICES

(75) Inventors: Zhijun Qu, Torrance, CA (US); Kenneth Wagers, Los Angeles, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/274,644

(22) Filed: Oct. 17, 2002

(65) Prior Publication Data
US 2003/0034519 A1    Feb. 20, 2003

Related U.S. Application Data

(63) Continuation of application No. 09/329,156, filed on Jun. 9, 1999, now abandoned.

(51) Int. Cl.
*H01L 21/33* (2006.01)
*H01L 21/3205* (2006.01)
*H01L 21/8238* (2006.01)
*H01L 21/336* (2006.01)

(52) U.S. Cl. .............. 438/761; 438/212; 438/268; 438/587

(58) Field of Classification Search ............ 438/212, 438/268, 270–271, 587–588, 282, 761; 257/328–345
See application file for complete search history.

(56) References Cited

U.S. PATENT DOCUMENTS

| | | | |
|---|---|---|---|
| 4,258,380 A | 3/1981 | Rogr | 257/541 |
| 4,680,853 A | 7/1987 | Lidow et al. | 29/571 |
| 4,705,759 A | 11/1987 | Lidow et al. | 438/267 |
| 4,803,533 A | 2/1989 | Chang et al. | 357/23.4 |
| 4,884,113 A | 11/1989 | Muramoto | 257/342 |
| 4,987,098 A | 1/1991 | Nishiura et al. | 437/142 |
| 5,521,410 A | 5/1996 | Yamamoto | 257/342 |
| 5,661,314 A | 8/1997 | Merrill et al. | 257/144 |
| 5,689,128 A | 11/1997 | Hshieh et al. | 257/331 |
| 5,838,042 A | 11/1998 | Zambrano | 257/342 |
| 6,207,993 B1 * | 3/2001 | Ishimura et al. | 257/335 |

FOREIGN PATENT DOCUMENTS

| | | |
|---|---|---|
| EP | 0118921 A2 | 9/1984 |
| EP | 0335750 | 10/1989 |
| JP | 57-042164 | 3/1982 |
| JP | 02-037777 | 2/1990 |
| JP | 02-047874 | 2/1990 |
| JP | 03-034466 | 2/1991 |
| JP | 08-213615 | 8/1996 |

* cited by examiner

*Primary Examiner*—Shouxiang Hu
(74) *Attorney, Agent, or Firm*—Ostrolenk, Faber, Gerb & Soffen, LLP

(57) ABSTRACT

The epitaxial silicon junction receiving layer of a power semiconductor device is formed of upper and lower layers. The lower layer has a resistivity of more than that of the upper layer and a thickness of more than that of the upper layer. The total thickness of the two layers is less than that of a single epitaxial layer that would be used for the same blocking voltage. P-N junctions are formed in the upper layer to define a vertical conduction power MOSFET device. The on-resistance is reduced more than 10% without any blocking voltage reduce. The upper epitaxial layer can be either by direct second layer deposition or by ion implantation of a uniform epitaxial layer followed by a driving process.

6 Claims, 4 Drawing Sheets

DUAL EPITAXIAL LAYER FOR HIGH VOLTAGE VERTICAL CONDUCTION POWER MOSFET DEVICES

CROSS-REFERENCE TO RELATED APPLICATION

This application is a continuation of U.S. patent application Ser. No. 09/329,156, filed Jun. 9, 1999 in the names of Zhijun Qu and Kenneth Wagers and entitled DUAL EPITAXIAL LAYER FOR HIGH VOLTAGE VERTICAL CONDUCTION POWER MOSFET DEVICES

FIELD OF THE INVENTION

This invention relates to MOSFET semiconductor devices and more specifically relates to a novel structure and process for manufacture of a vertical conduction power MOSFET device which has a reduced on resistance.

BACKGROUND OF THE INVENTION

Vertical conduction Power MOSFET devices are well known. Such devices may be made as disclosed, for example, in U.S. Pat. No. 5,007,725, as planar, cellular devices, or can be made with a well known parallel stripe topology, or can be made using a trench technology.

The on-resistance (RDSON) of such devices is dependant in large measure on the resistivity of the epitaxially formed silicon layer which receives the device junctions, and this resistivity is, in turn, determined by the blocking voltage requirement of the final device. Thus, higher blocking voltages require a higher resistivity in the epitaxial layer, but this then causes an increase on resistance for the device.

It would be very desirable to provide a structure for high voltage devices, particularly those having a blocking voltage greater than about 100 volts, which can have a reduced on-resistance without sacrificing any substantial blocking voltage.

BRIEF DESCRIPTION OF THE INVENTION

A novel dual (or graded) epitaxial junction-receiving layer is provided in accordance with the invention in which two layers are sequentially epitaxially deposited atop a silicon substrate. The lower layer has a uniform resistivity which is higher than that of the uniform resistivity of the upper layer. The upper layer has a depth sufficiently thick to receive all device junctions and may be about one fifth of the thickness of the lower layer. Furthermore, it has been found possible to reduce the total thickness of the two epi layers from that which was necessary for a single layer epi of the prior art, as will be later described, thereby producing a reduced on-resistance for a given design rating.

It has been found that the novel structure of the invention will produce a reduction in on-resistance of a given device design by greater than about 10% in exchange for no reduction in breakdown voltage.

DETAILED DESCRIPTION OF THE INVENTION

Figure 1:
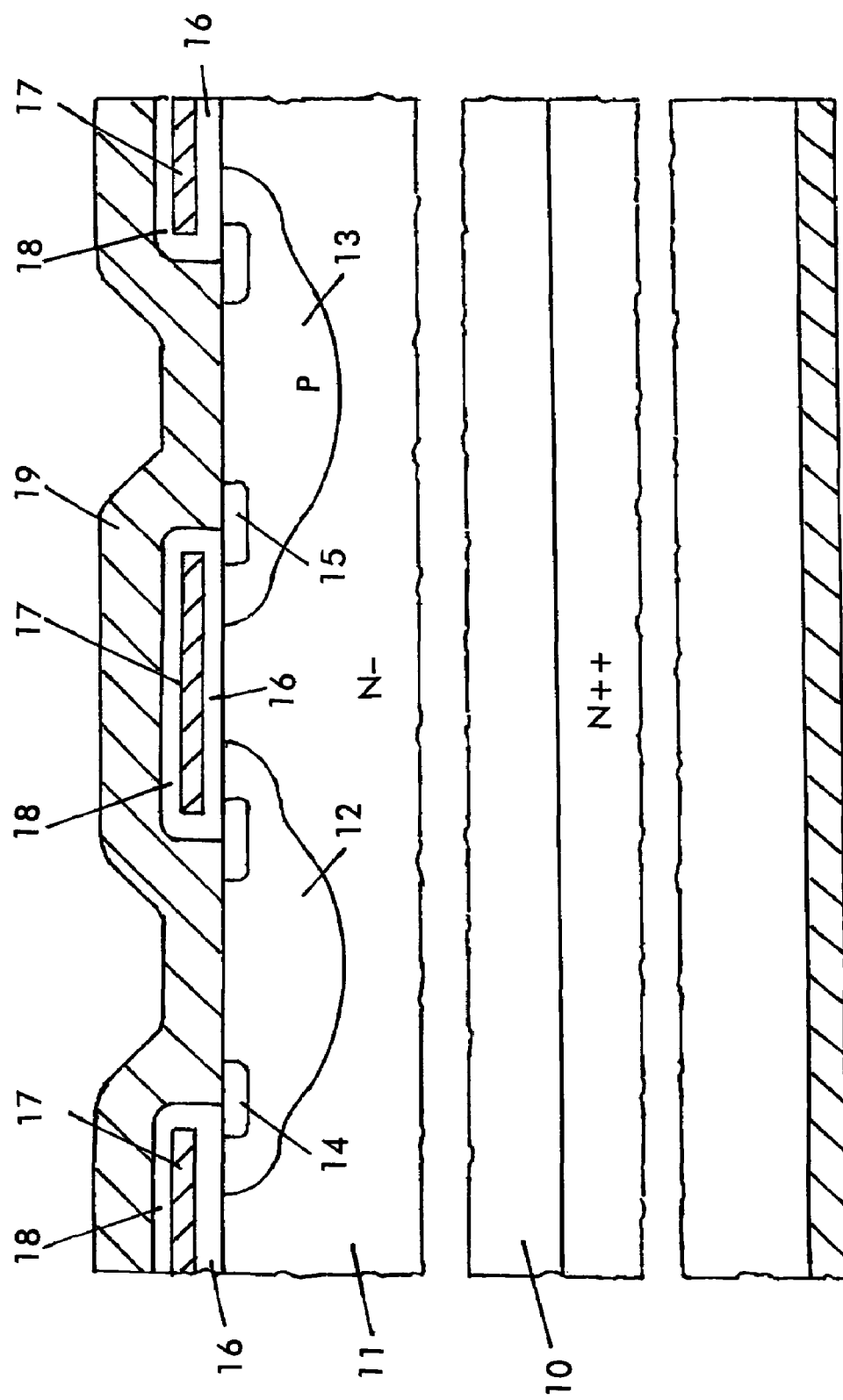
FIG. 1 is a cross-sectional view of a typical prior art vertical conduction MOSFET with a single junction receiving epitaxial layer.

Referring first to FIG. 1, there is shown a typical vertical conduction MOSFET in cross-section as having a highly conductive $N^{++}$ substrate 10 which has a single epitaxially deposited ⁻layer 11 thereon. ⁻layer 11 receives the various junctions needed to create the device such as spaced P type base diffusions 12 and 13 which contain $N^+$ source diffusion rings 14 and 15 respectively (for a cellular topology).

The invertible channel areas between the peripheries of the source rings and base diffusions are covered with a gate oxide layer 16 and a conductive polysilicon gate electrode 17. Gate electrode 17 is covered by an interlayer oxide 18 and the device upper surface is covered by an aluminum source electrode 19. The bottom of the wafer or chip receives a drain electrode 20.

The structure of FIG. 1 is typical of many kinds of devices which can benefit from the invention, as will be later described. Thus, the device, shown as an N channel device, can be a P channel device (reversing all conductivity types) and the device can employ a trench topography instead of the planar topography shown.

In designing the device of FIG. 1, two key design parameters are reverse blocking voltage and on resistance. The device blocking voltage is function of the thickness of epi layer 11 and its resistivity σ. More specifically, if the electric field in the epi layer 11 is plotted against depth, as in FIG. 2, the blocking voltage can be shown to be proportional to the shaded area under the curve. The device on-resistance is proportional to the resistivity p of the epi and is inverse proportional to the slope of the straight line in FIG. 2. It will be seen that if blocking voltage is increased, the slope of the curve must decrease. Thus, design trade-offs are always need for designing a device with a given blocking voltage or given on-resistance.

Figure 3:
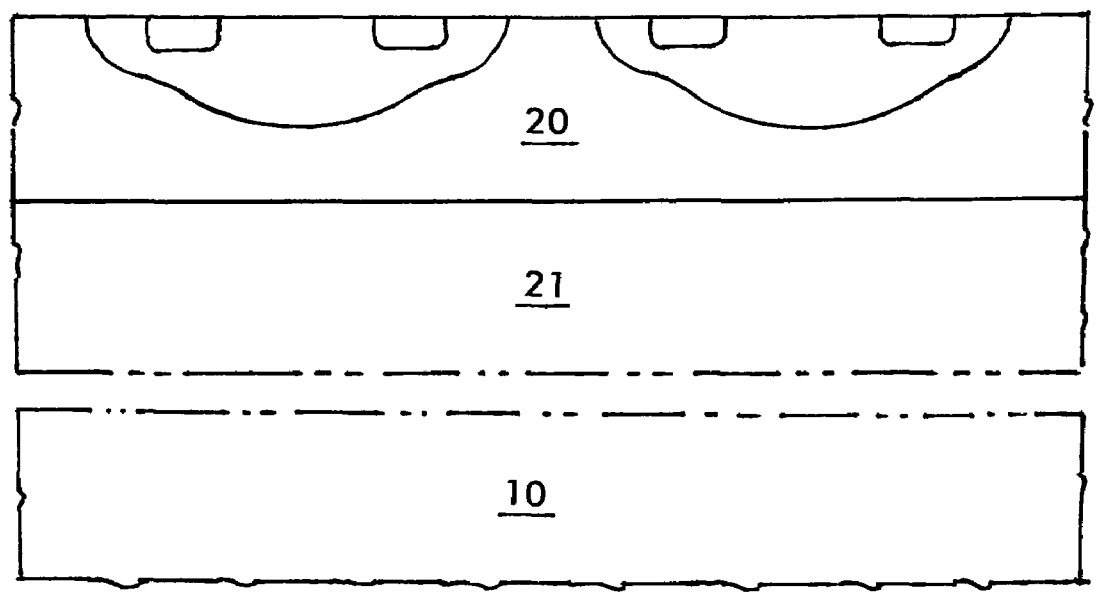
FIG. 3 is a cross-sectional view of the dual epitaxial layer structure used in accordance with the invention.
Figure 2:
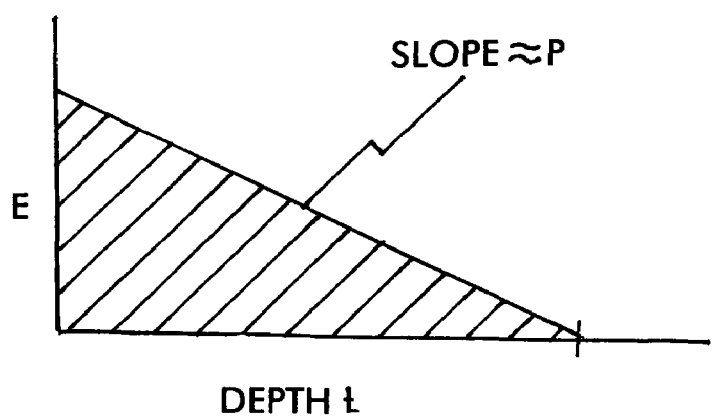
FIG. 2 is a diagram showing the electric field in the single epi layer of FIG. 1 as a function of depth during a voltage blocking condition.

The present invention permits the designer to change the shape of the curve of FIG. 2 in such a way that the area (blocking voltage) can be increased (or kept about constant) while the total epi depth can be reduced and the slope of the line can be generally unchanged for the bulk of the epi depth. More specifically, and as shown in FIG. 3, the epi layer 11 of FIG. 1 is divided into an upper junction receiving layer of reduced resistivity and a lower epi layer 21 of greater resistivity than that of layer 20, but of greater thickness. In a 600 volt device layer 20 of FIG. 3, typically may be about 10 microns thick, and greater than the depth of the base junctions 12 and 13. Layer 21 is thicker than layer 20 for high voltage device. Obviously different values will be used for different breakdown voltages. In general, the resistivity of lower layer 21 is higher than that of layer 20.

For a conventional 600 volt device, epi layer 11 of FIG. 1 is typically 21.5 ohm-cm and 57 microns thick. This produces a device with on-resistance of about 0.68 ohms. This device is replaced, in accordance with the invention, by the device of FIG. 3 in which layer 20 is 7 ohm-cm (a value which would be used for a 250 volt device) while layer 21 is 21.5 ohm-cm material (conventional for 600 volt devices). Layers 20 and 21 have thicknesses of 7 and 48 microns respectively.

Figure 4:
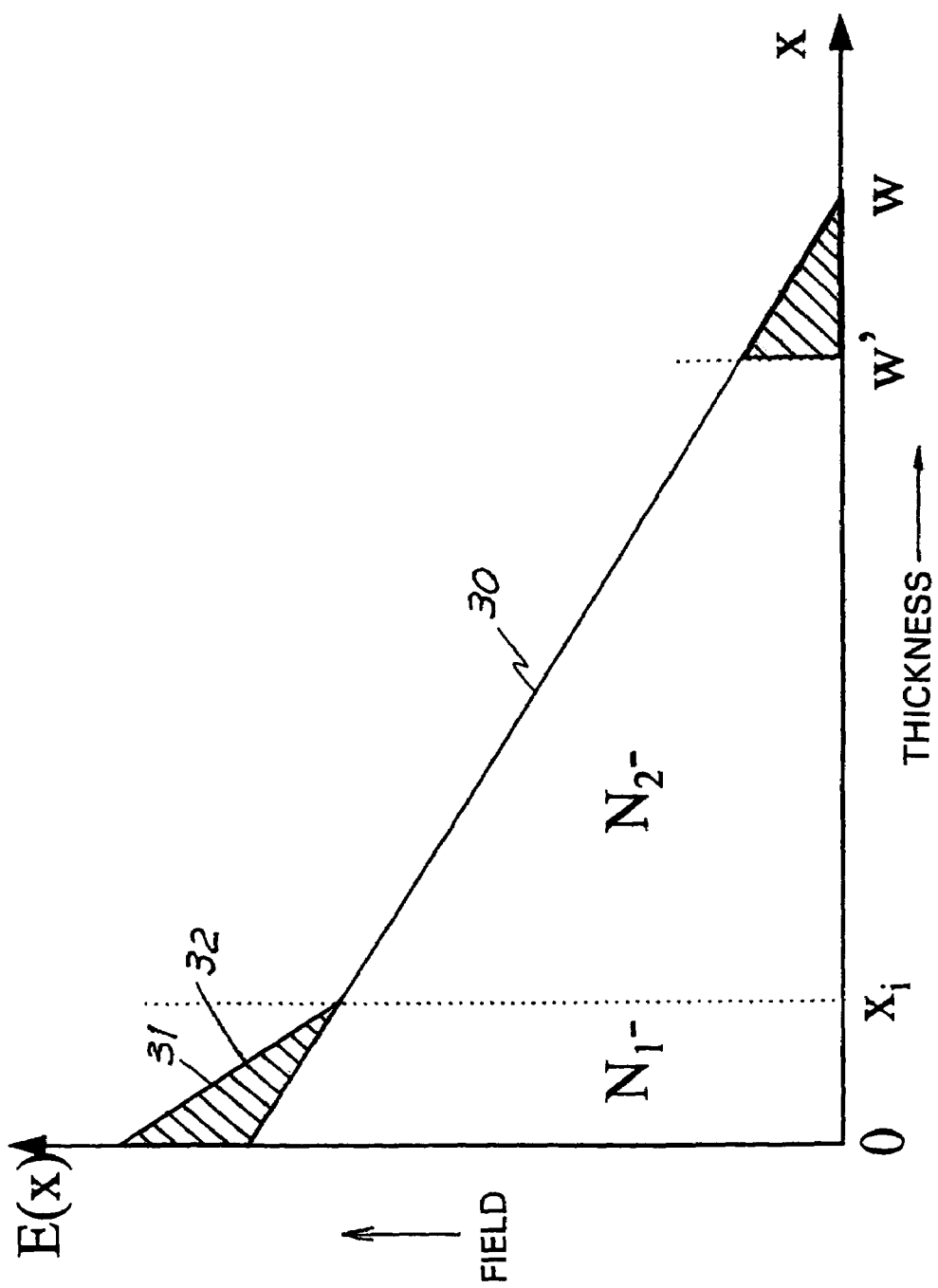
FIG. 4 shows a diagram like that of FIG. 2, but modified in accordance with the invention.

The effect of this dual layer structure, with a lower resistivity upper layer 20 is shown in FIG. 4. The line 30 in FIG. 4 has the same slope as the line in FIG. 2. However, the area under the curve of FIG. 4 is increased by the shaded area 31 caused by the segment 32 of greater slope. Thus, in FIG. 4, the lower resistivity epi 20 of FIG. 3 has the depth $x_i$; and the total depth of regions 20 and 21 is reduced from depth W (for the design of FIG. 1) to W'.

Consequently, the device of FIG. 3 has the same breakdown voltage as that of FIG. 2 since the area under the curve in FIG. 4 is about the same as that of FIG. 2. However, the on-resistance is reduced because of the total reduced epi depth and the reduced resistivity in the first epi layer. These resistance comparisons are listed directly on FIG. 5, comparing the total on-resistances of the single and dual epi layer embodiments.

Figure 5:
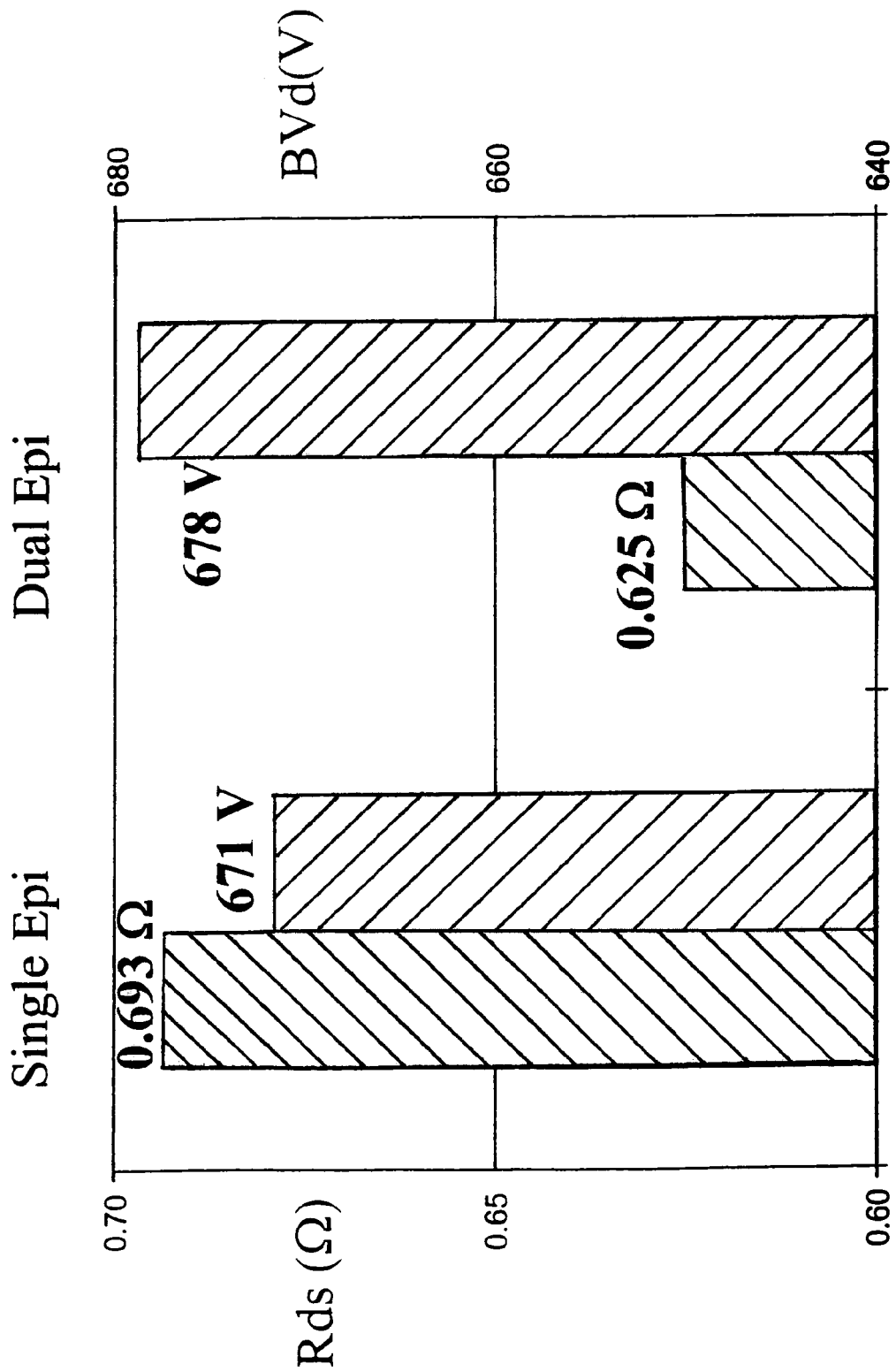
FIG. 5 shows a bar graph comparison of a single layer epi structure and the rating-equivalent dual layer epi structure of the invention.

FIG. 5 shows the breakdown voltage and on-resistances of equivalent devices using single and dual epi structures.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method of producing a MOS-gated semiconductor device, comprising:
   providing a dual epitaxial junction-receiving layer, including: providing a first epitaxially grown layer of a first conductivity type and a first resistivity over a substrate; and
   providing a second epitaxially grown layer of the first conductivity type and a second resistivity over said first epitaxially grown layer, said second resistivity being different from said first resistivity;
   forming body regions of a second conductivity type in said second epitaxially grown layer, each of the body regions having a depth that is less than the thickness of said second epitaxially grown layer, said body regions forming PN junctions with said second epitaxially grown layer to obtain a device breakdown voltage for said device;
   forming source regions of said first conductivity type in said body regions; and
   forming a gate structure over said second epitaxially grown layer,
   wherein selections of a concentration of dopants and a thickness of each said first and said second epitaxially grown layers so as to obtain a device breakdown voltage and a total thickness of the first and second expitaxially grown layers involve a comparison in electric field distribution with a power MOSFET having a same structure as that of said device, except that the power MOSFET only has a single epitaxial junction-receiving layer therein, said single epitaxial junction-receiving layer being of said first conductivity type and having a same concentration of dopants as that in said first epitaxially grown layer and receiving body regions same as the body regions in said device, and,
   wherein said device breakdown voltage is the same as a device breakdown voltage of the power MOSFET and wherein said total thickness is less than the thickness of said single epitaxial junction-receiving layer.

2. A method according to claim 1, wherein said device is a vertical conduction power MOSFET.

3. A method according to claim 1, wherein said second resistivity is less than said first resistivity.

4. A method for fabricating a semiconductor device comprising:
   providing a silicon substrate having a first and second surface;
   providing a dual epitaxial junction-receiving silicon layer, including: forming a first epitaxial layer of epitaxial silicon atop said first surface having impurities of the n or p conductivity type uniformly distributed throughout the volume of said first epitaxial layer; and
   forming a second epitaxial layer of epitaxial silicon atop said first epitaxial layer and coextensive therewith having impurities of the same type as those in said first epitaxial layer uniformly distributed therethrough, the thickness of said second epitaxial layer being smaller than that of said first epitaxial layer and the concentration of impurities in said second epitaxial layer being greater than the concentration of impurities in said first epitaxial layer; and
   forming a plurality of diffusions of a conductivity type opposite to that of said second epitaxial layer uniformly distributed into and contained within said second epitaxial layer to define a plurality of p-n junctions therein, said plurality of diffusions and said first and second epitaxial layers resulting in a rated breakdown voltage for said devices,
   wherein selections of the resistivity of each of the first and second epitaxial layers of epitaxial silicon so as to obtain said rated breakdown voltage and a total thickness of said first and second epitaxial layers of epitaxial silicon involve a comparison in electric field distribution with a power MOSFET having a same structure as that of said device, except that the power MOSFET only has a single epitaxial junction-receiving silicon layer therein, said single epitaxial junction-receiving silicon layer having a same resistivity as that in said first epitaxial layer of epitaxial silicon and having a plurality of diffusions therein same as the plurality of diffusions in said device; and,
   wherein said rated breakdown voltage is the same as a rated breakdown voltage of the power MOSFET so that the total thickness of said first and second epitaxial layers of epitaxial silicon is less than the thickness of said single epitaxial junction-receiving silicon layer.

5. The method of claim 4, wherein the resistivity of said second epitaxial layer is lower than that of said first epitaxial layer.

6. The device method of claim 4, wherein said device is a vertical conduction power MOSFET.

* * * * *